(12) United States Patent
Wang et al.

(10) Patent No.: US 11,500,427 B1
(45) Date of Patent: Nov. 15, 2022

(54) SYSTEMS AND METHODS FOR DISCONNECTION OF BATTERY WHEN SERVICING INFORMATION HANDLING SYSTEM

(71) Applicant: Dell Products L.P., Round Rock, TX (US)

(72) Inventors: Isaac Q. Wang, Austin, TX (US); Anthony W. Howard, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 29 days.

(21) Appl. No.: 17/330,964

(22) Filed: May 26, 2021

(51) Int. Cl.
*H05K 1/02* (2006.01)
*G06F 1/16* (2006.01)
*H05K 1/18* (2006.01)
*H05K 1/11* (2006.01)
*H05K 7/14* (2006.01)

(52) U.S. Cl.
CPC .......... *G06F 1/1662* (2013.01); *G06F 1/1681* (2013.01); *H05K 1/0213* (2013.01); *H05K 1/111* (2013.01); *H05K 1/181* (2013.01); *H05K 7/1427* (2013.01); *H05K 2201/10409* (2013.01)

(58) Field of Classification Search
CPC .... H05K 1/0213; H05K 1/111; H05K 7/1427; H05K 2201/10409
See application file for complete search history.

(56) References Cited

U.S. PATENT DOCUMENTS

| | | | |
|---|---|---|---|
| 5,991,164 A * | 11/1999 | Saito | H01T 4/08 361/752 |
| 8,553,425 B2 * | 10/2013 | Li | G06F 1/26 361/759 |
| 2011/0031985 A1 * | 2/2011 | Johnson | H05K 1/0275 324/681 |

* cited by examiner

*Primary Examiner* — Sherman Ng
(74) *Attorney, Agent, or Firm* — Jackson Walker L.L.P.

(57) ABSTRACT

An information handling system may include a battery, a circuit board, an enclosure, and a control circuit. The circuit board may include at least one electric component, a first electrically conductive pad, and a second electrically conductive pad in proximity to the first electrically conductive pad. The enclosure may be configured to house components of the information handling system including the battery and the circuit board, and the enclosure may include a first member, a second member configured to be mechanically coupled to the first member, and a mechanical component comprising conductive material and configured to electrically short the first electrically conductive pad to the second electrically conductive pad when the first member is mechanically coupled to the second member, and cause electrical isolation of the first electrically conductive pad from the second electrically conductive pad when the first member is mechanically decoupled from the second member. The control circuit may be configured to, when the first electrically conductive pad is shorted to the second electrically conductive pad, cause the at least one electrical component to be electrically coupled to the battery and when the first electrically conductive pad is electrically isolated from the second electrically conductive pad, cause the at least one electrical component to be electrically decoupled from the battery.

21 Claims, 7 Drawing Sheets

SYSTEMS AND METHODS FOR DISCONNECTION OF BATTERY WHEN SERVICING INFORMATION HANDLING SYSTEM

TECHNICAL FIELD

The present disclosure relates in general to information handling systems, and more particularly to a semi-solid hinge cover that enables an information handling system with a thin profile.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Because of their mobility, consumers of information handling systems increasingly use laptops. A laptop, often referred to as a "notebook", may be a small, portable information handling system with a "clamshell" form factor including a keyboard assembly on a lower portion of the clamshell and a display assembly comprising a thin liquid crystal display screen or light-emitting diode display screen on an upper portion of the clamshell, with the keyboard assembly mechanically coupled to the display assembly via a mechanical hinge. Accordingly, the keyboard assembly and the display assembly may be rotated to an open position in order for a user to use the laptop. Conversely, a user may fold a laptop into its closed position for transportation, and thus it may be suitable for mobile use.

Often, a keyboard assembly may enclose numerous functional components of an information handling system, such as a keyboard, a motherboard including one or more processors and connectors for receiving memory modules and other components, one or more storage devices (e.g., solid state drives), and/or one or more air movers (e.g., fans or blowers) for cooling components of the information handling system. In many instances, a keyboard assembly may be formed using a solid base (sometimes referred to as a "D-door" or "D-cover") mechanically coupled to a cover (sometimes referred to as a "C-cover" or "palm rest") having an opening for exposing keys of the keyboard.

To service components of an information handling system, a user or technician may decouple the base from the cover to perform operations such as cleaning air movers, adding thermal grease, replacing memory modules and/or storage devices, and/or other servicing. When an unskilled person performs such servicing, such person may negligently fail to disconnect the battery from the motherboard and other electrical components, such that the electronic components of the information handling system may be exposed to a high risk of electrical short circuit, which can cause permanent and costly damage. Accordingly, systems and methods to reduce or eliminate such risks are desirable.

SUMMARY

In accordance with the teachings of the present disclosure, the disadvantages and problems associated existing approaches to servicing of components in an information handling system may be reduced or eliminated.

In accordance with embodiments of the present disclosure, an information handling system may include a battery, a circuit board, an enclosure, and a control circuit. The circuit board may include at least one electric component, a first electrically conductive pad, and a second electrically conductive pad in proximity to the first electrically conductive pad. The enclosure may be configured to house components of the information handling system including the battery and the circuit board, and the enclosure may include a first member, a second member configured to be mechanically coupled to the first member, and a mechanical component comprising conductive material and configured to electrically short the first electrically conductive pad to the second electrically conductive pad when the first member is mechanically coupled to the second member, and cause electrical isolation of the first electrically conductive pad from the second electrically conductive pad when the first member is mechanically decoupled from the second member. The control circuit may be configured to, when the first electrically conductive pad is shorted to the second electrically conductive pad, cause the at least one electrical component to be electrically coupled to the battery, and when the first electrically conductive pad is electrically isolated from the second electrically conductive pad, cause the at least one electrical component to be electrically decoupled from the battery.

In accordance with these and other embodiments of the present disclosure, a control circuit for use in an information handling system may include a battery, a circuit board comprising at least one electric component, a first electrically conductive pad, and a second electrically conductive pad in proximity to the first electrically conductive pad, and further comprising an enclosure configured to house components of the information handling system including the battery and the circuit board, the enclosure comprising a first member, a second member configured to be mechanically coupled to the first member, and a mechanical component comprising conductive material and configured to electrically short the first electrically conductive pad to the second electrically conductive pad when the first member is mechanically coupled to the second member, and cause electrical isolation of the first electrically conductive pad from the second electrically conductive pad when the first member is mechanically decoupled from the second member. The control circuit may be configured to, when the first electrically conductive pad is shorted to the second electrically conductive pad, cause the at least one electrical component to be electrically coupled to the battery, and when the first electrically conductive pad is electrically isolated from the second electrically conductive pad, cause the at least one electrical component to be electrically decoupled from the battery.

In accordance with these and other embodiments of the present disclosure, a method may be provided for use in an information handling system may include a battery, a circuit board comprising at least one electric component, a first electrically conductive pad, and a second electrically conductive pad in proximity to the first electrically conductive pad, and further comprising an enclosure configured to house components of the information handling system including the battery and the circuit board, the enclosure comprising a first member, a second member configured to be mechanically coupled to the first member, and a mechanical component comprising conductive material and configured to electrically short the first electrically conductive pad to the second electrically conductive pad when the first member is mechanically coupled to the second member, and cause electrical isolation of the first electrically conductive pad from the second electrically conductive pad when the first member is mechanically decoupled from the second member. The control circuit may be configured to, when the first electrically conductive pad is shorted to the second electrically conductive pad, cause the at least one electrical component to be electrically coupled to the battery, and when the first electrically conductive pad is electrically isolated from the second electrically conductive pad, cause the at least one electrical component to be electrically decoupled from the battery. The method may include, when the first electrically conductive pad is shorted to the second electrically conductive pad, causing the at least one electrical component to be electrically coupled to the battery, and when the first electrically conductive pad is electrically isolated from the second electrically conductive pad, causing the at least one electrical component to be electrically decoupled from the battery.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 10, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU") or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems (BIOSs), buses, memories, I/O devices and/or interfaces, storage resources, network interfaces, motherboards, and/or any other components and/or elements of an information handling system.

Figure 1:
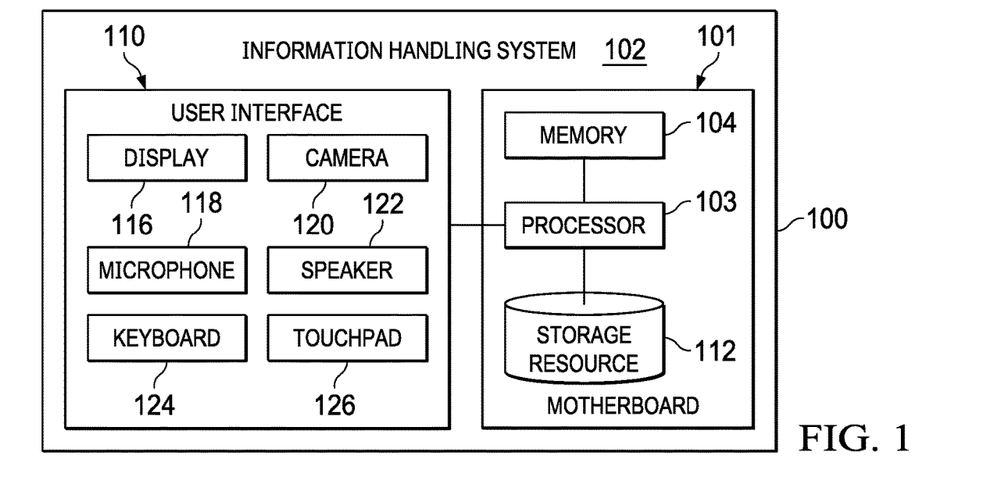
FIG. 1 illustrates a functional block diagram of selected components of an example information handling system, in accordance with embodiments of the present disclosure.

FIG. 1 illustrates a block diagram of an example information handling system 102. In some embodiments, information handling system 102 may be a personal computer (e.g., a desktop computer, a laptop, notebook, tablet, handheld, smart phone, personal digital assistant, etc.). As depicted in FIG. 1, information handling system 102 may include an enclosure 100 housing a plurality of information handling resources including, without limitation, a motherboard 101 and a user interface 110 communicatively coupled to motherboard 101.

Enclosure 100 may include any structure or aggregation of structures that serves as a container for one or more information handling systems and information handling resources, and may be constructed from steel, aluminum, plastic, and/or any other suitable material. Although the term "enclosure" is used, enclosure 100 may also be referred to as a case, cabinet, tower, box, chassis, and/or housing. In some embodiments, chassis 100 may be configured to hold and/or provide power to a plurality of information handling resources.

Motherboard 101 may comprise a circuit board configured to provide structural support for one or more information handling resources of information handling system 102 and/or electrically couple one or more of such information handling resources to each other and/or to other electric or electronic components external to information handling system 102. As shown in FIG. 1, motherboard 101 may include or have mounted thereon a processor 103, a memory 104 communicatively coupled to processor 103, and a storage resource 112 communicatively coupled to processor 103.

Processor 103 may include any system, device, or apparatus configured to interpret and/or execute program instructions and/or process data, and may include, without limitation, a microprocessor, microcontroller, digital signal processor (DSP), application specific integrated circuit (ASIC), field-programmable gate array (FPGA), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may include any system, device, or apparatus configured to retain program instructions and/or data for a period of time (e.g., computer-readable media). Memory 104 may include RAM, EEPROM, a PCMCIA card, flash memory, magnetic storage, opto-magnetic storage, or any suitable selection and/or array of volatile or non-volatile memory that retains data after power to information handling system 102 is turned off.

Storage resource 112 may include a system, device, or apparatus configured to store data. Storage resource 112 may include one or more hard disk drives, magnetic tape libraries, optical disk drives, magneto-optical disk drives, solid state storage drives, compact disk drives, compact disk arrays, disk array controllers, and/or any other systems, apparatuses or devices configured to store data. In certain embodiments, storage resource 112 may include one or more storage enclosures configured to hold and/or power one or more of such devices. In the embodiments represented by FIG. 1, storage resource 112 may reside within information handling system 102. However, in other embodiments, storage resource 112 may reside external to information handling system 102 (e.g., may be coupled to information handling system 102 via a network).

User interface 110 may comprise any instrumentality or aggregation of instrumentalities by which a user may interact with information handling system 102. For example, user interface 110 may permit a user to input data and/or instructions into information handling system 102 (e.g., via a keypad, keyboard, touch screen, touch pad, microphone, camera, and/or other data input device), and/or otherwise manipulate information handling system 102 and its associated components. User interface 110 may also permit information handling system 102 to communicate data to a user (e.g., via a display device, speaker, and/or other data output device). As shown in FIG. 1, user interface 110 may include one or more of a display 116, a microphone 118, a camera 120, a speaker 122, a keyboard 124, and/or a touchpad 126.

A display 116 may comprise any suitable system, device, or apparatus configured to display human-perceptible graphical data and/or alphanumeric data to a user. For example, in some embodiments, display 116 may comprise a liquid crystal display.

A microphone 118 may comprise any system, device, or apparatus configured to convert sound incident at microphone 118 to an electrical signal that may be processed by processor 103. In some embodiments, microphone 118 may include a capacitive microphone (e.g., an electrostatic microphone, a condenser microphone, an electret microphone, a microelectromechanical systems (MEMs) microphone, etc.) wherein such sound is converted to an electrical signal using a diaphragm or membrane having an electrical capacitance that varies based on sonic vibrations received at the diaphragm or membrane.

A camera 120 may comprise any system, device, or apparatus configured to record images (moving or still) into one or more electrical signals that may be processed by processor 103.

A speaker 122 may comprise any system, device, or apparatus configured to produce sound in response to electrical audio signal input. In some embodiments, a speaker 122 may comprise a dynamic loudspeaker, which employs a lightweight diaphragm mechanically coupled to a rigid frame via a flexible suspension that constrains a voice coil to move axially through a cylindrical magnetic gap such that when an electrical signal is applied to the voice coil, a magnetic field is created by the electric current in the voice coil, making it a variable electromagnet. The coil and the driver's magnetic system interact, generating a mechanical force that causes the coil (and thus, the attached cone) to move back and forth, thereby reproducing sound under the control of the applied electrical signal coming from the amplifier.

Keyboard 124 may include any system, device, or apparatus having a plurality of keys configured to allow a user to provide input to information handling system 102 by interacting with such plurality of keys.

Touchpad 126 (which may also be referred to as a trackpad) may include any system, device, or apparatus that serves as a pointing device, and may include a tactile sensor that can translate the motion and position of a user's fingers to a relative position on the operating system that is made output to the screen.

In addition to motherboard 101, processor 103, memory 104, storage resource 112, and user interface 110, information handling system 102 may include one or more other information handling resources.

Figure 2:
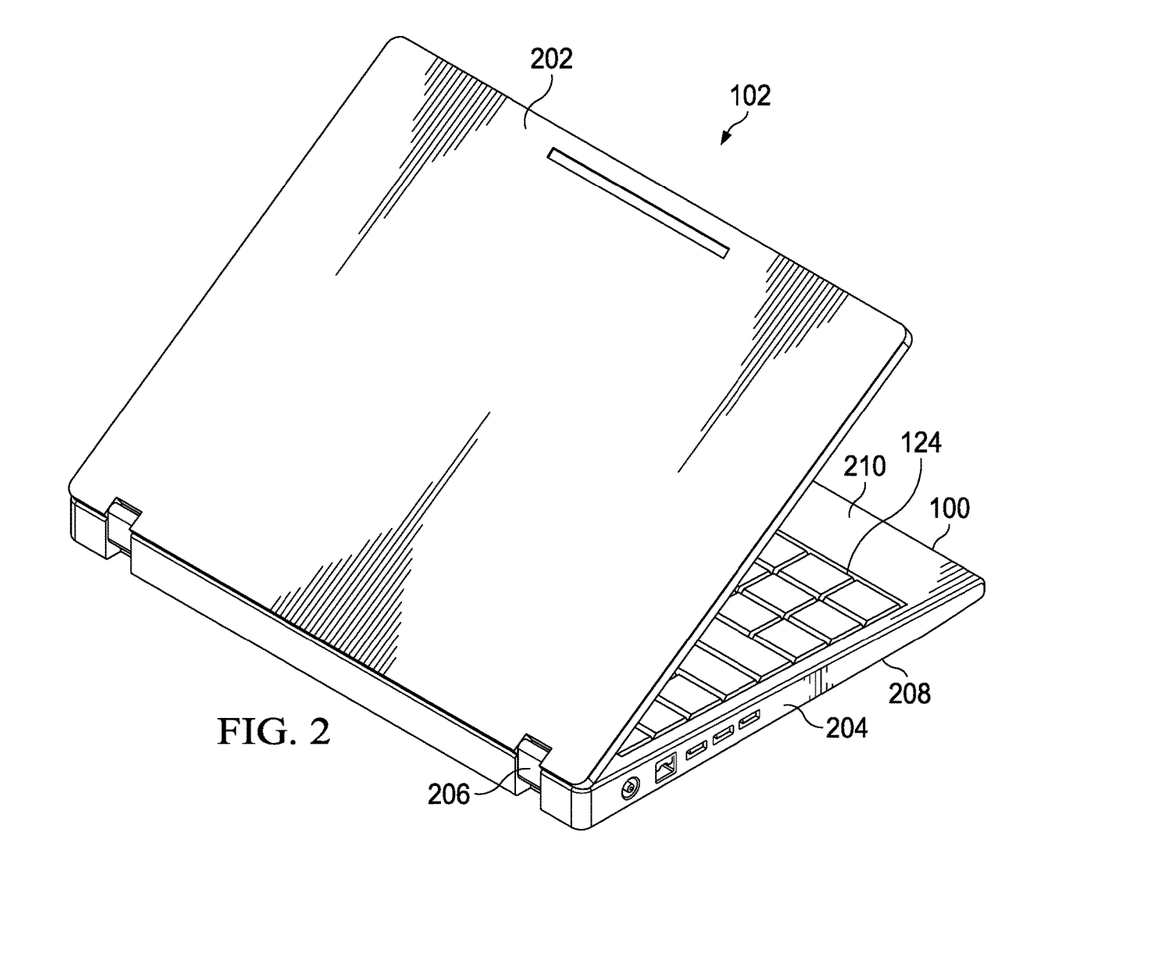
FIG. 2 illustrates an exterior perspective view of an example information handling system, in accordance with embodiments of the present disclosure.

FIG. 2 illustrates a perspective exterior view of example information handling system 102 embodied as a notebook or laptop computer, in accordance with embodiments of the present disclosure. As depicted in FIG. 2, information handling system 102 may include a display assembly 202 (which may house display 116 and/or other information handling resources, and is often referred to in the art as a "hinge-up") and a keyboard assembly 204 (which may house keyboard 124, touchpad 126, and/or other information handling resources, and is often referred to in the art as a "base" or "base assembly") coupled via one or more hinges 206. Each of display assembly 202 and keyboard assembly 204 may be integral parts of an enclosure 100 for information handling system 102. Each of display assembly 202 and keyboard assembly 204 may have an enclosure made from one or more suitable materials, including without limitation plastic, steel, and/or aluminum. Although information handling system 102 is shown in FIG. 2 as having certain components (e.g., display assembly 202, keyboard assembly 204, and hinge 206), information handling system 102 may include any other suitable components which may not have been depicted in FIG. 2 for the purposes of clarity and exposition. In operation, information handling system 102 may be translated between a closed position (e.g., a position of display assembly 202 relative to keyboard assembly 204 such that display assembly 202 substantially overlays keyboard assembly 204, or vice versa) and an open position (e.g., a position of display assembly 202 relative to keyboard assembly 204 such that display assembly 202 does not substantially overlay keyboard assembly 204, or vice versa, such as when the angle formed by display assembly 202 and keyboard assembly 204 at hinge 206 is substantially non-zero). In some embodiments, a user may be able to open information handling system 102 into a tablet mode, by rotating display assembly 202 relative to keyboard assembly 204 to an angle of 360 degrees relative to the closed position.

As shown in FIG. 2, keyboard assembly 204 may be formed using a solid base 208 (a "D-door") mechanically coupled to a cover 210 (sometimes referred to as a "C-cover" or "palm rest") having an opening for exposing keys of keyboard 124 and touchpad 126. Keyboard assembly 204 may enclose numerous functional components of an information handling system 102, including without limitation keyboard 212, motherboard 101, one or more air movers (e.g., fans or blowers) for cooling components of the information handling system 102, and/or other components.

Figure 3:
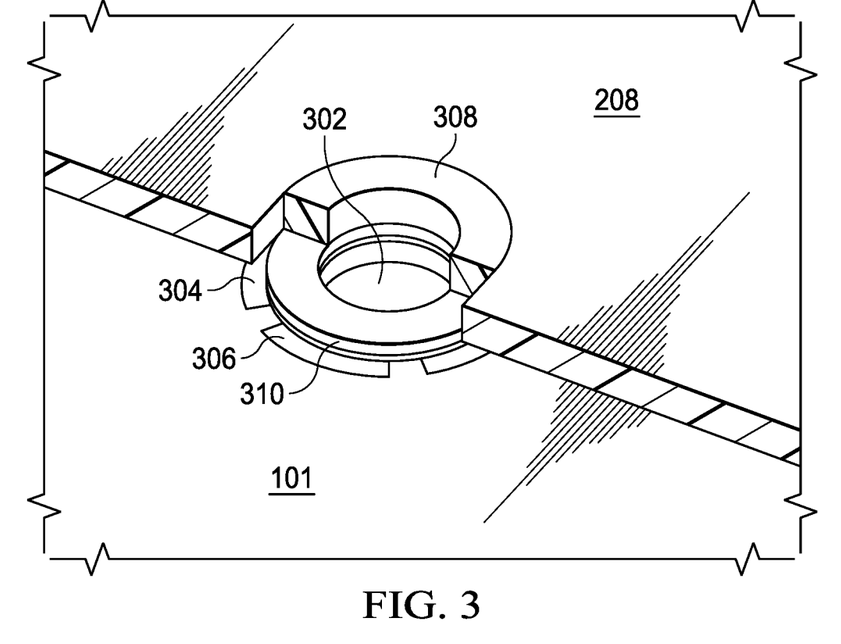
FIG. 3 illustrates a perspective view of selected components of an information handling system, in accordance with embodiments of the present disclosure.

FIG. 3 illustrates a perspective view of selected components of information handling system 102, in accordance with embodiments of the present disclosure. In particular, FIG. 3 illustrates a view of a "bottom" of information handling system 102, with a portion of base 208 cut away for purposes of exposition. To aid in description of FIG. 3, FIG. 4 illustrates a top plan view of a mounting hole 302 formed in motherboard 101, in accordance with embodiments of the present disclosure.

Figure 4:
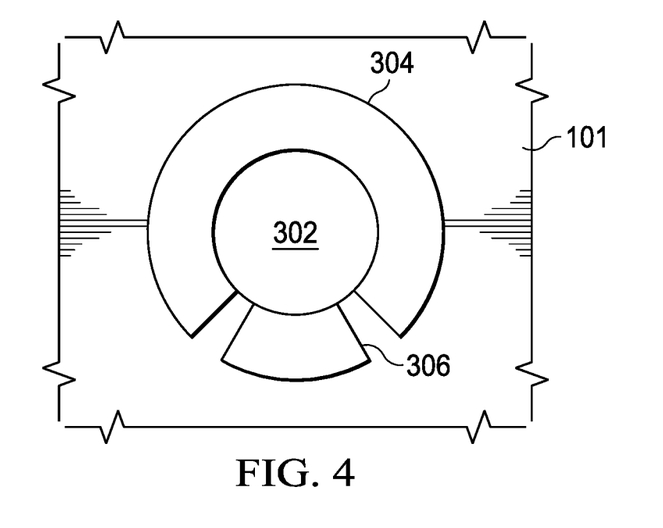
FIG. 4 illustrates a top plan view of a mounting hole formed in a motherboard, in accordance with embodiments of the present disclosure.

As shown in FIGS. 3 and 4, motherboard 101 may have formed therein a mounting hole 302. To mechanically couple base 208 to cover 210, a fastener (e.g., a screw) may be passed through an opening in a guide feature 308 of base 208 and passed through mounting hole 302 to mechanically engage with a corresponding member (e.g., a threaded insert) of cover 210. Base 208, cover 210, and motherboard 101 may have similar mounting features formed throughout for mechanically coupling base 208 to cover 210 and aligning motherboard 101 within keyboard assembly 204.

As also shown in FIGS. 3 and 4, motherboard 101 may have two electrically-conductive pads 304 and 306 formed proximate to mounting hole 302. For example, electrically-conductive pads 304 and 306 may be formed from a circular ring of conductive material concentric with mounting hole 302, but with discontinuities formed therein to electrically isolate pad 304 from pad 306. Accordingly, when an item of electrically-conductive material is placed in mechanical contact with both of pad 304 and pad 306, pad 304 and pad 306 may be electrically shorted to one another.

As shown in FIG. 3, guide feature 308 may have formed thereon a conductive material 310 (e.g., a conductive plate, a conductive foam, or other item of conductive material) that is configured to, when base 208 is mechanically coupled to cover 210 via a fastener through mounting hole 302, electrically short pad 304 to pad 306. Although FIG. 3 depicts conductive material 310 being formed upon guide feature 308, conductive material 310 may be formed on other features, including on a fastener for mechanically coupling base 208 to cover 210 via mounting hole 302.

Thus, as described in greater detail below, when base 208 is mechanically coupled to cover 210 via a fastener through mounting hole 302, an electrical path between pad 304 and pad 306 may be closed via conductive material 310, causing a battery of information handling system 102 to electrically couple to motherboard 101 and/or other components of information handling system 102. On the other hand, when such fastener is removed from mounting hole 302 and/or base 208 is removed from cover 210, an electrical path between pad 304 and pad 306 may be opened, causing a battery of information handling system 102 to electrically decouple from motherboard 101 and/or other components of information handling system 102, thus reducing the risk of electrical short to components of information handling system 102 when being serviced.

Figure 5A:
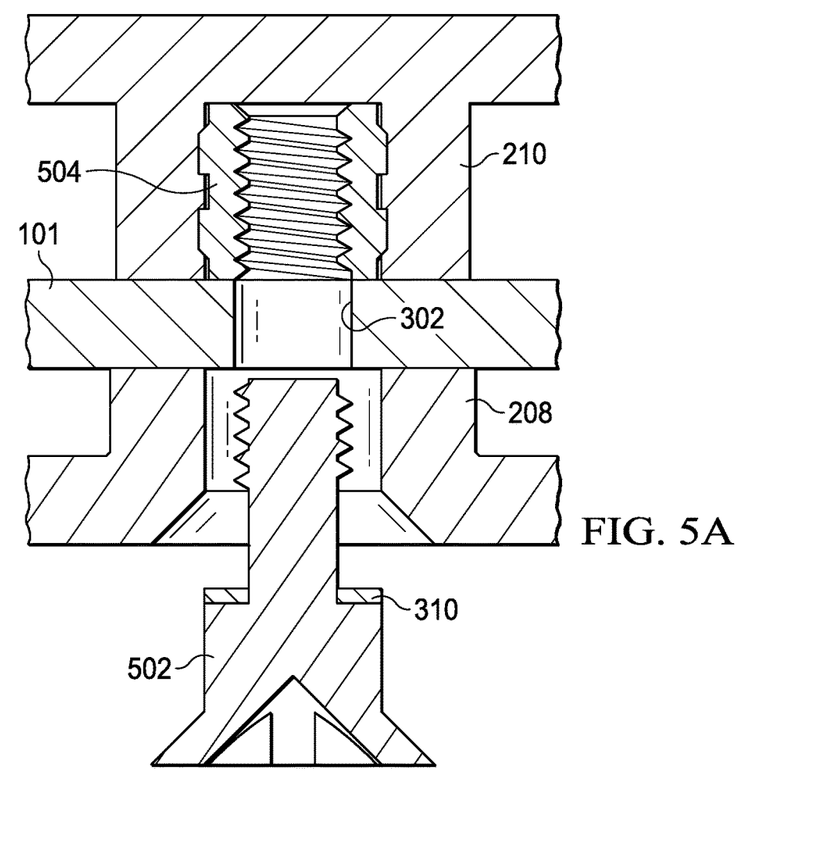
FIGS. 5A and 5B illustrate a side cross-sectional view of selected features for an example approach of engaging a base of a keyboard assembly to a cover of a keyboard assembly, in accordance with embodiments of the present disclosure.
Figure 5B:
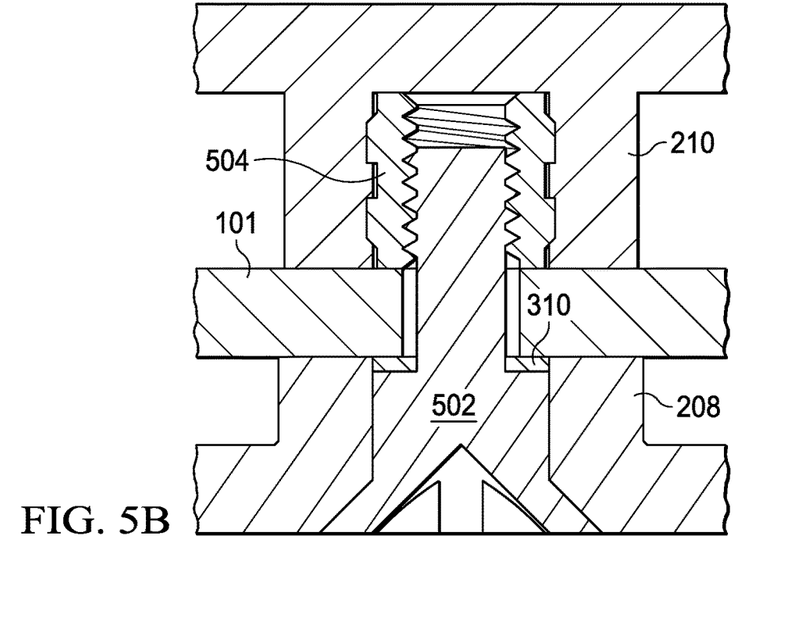

FIGS. 5A and 5B illustrate a side cross-sectional view of selected features for an example approach of engaging base 208 to cover 210, in accordance with embodiments of the present disclosure. As shown in FIGS. 5A and 5B, electrically-conductive material 310 may be formed under a head of a screw 502 configured to mechanically engage with a threaded insert 504 of cover 210. In FIG. 5A, screw 502 is shown as mechanically disengaged from threaded insert 504 and electrically-conductive material 310 is not in physical contact with pads 304 and 306, and thus, pad 304 may be electrically isolated from pad 306. In FIG. 5B, screw 502 is shown as mechanically engaged with threaded insert 504, thus causing physical contact of electrically-conductive material 310 to both of pads 304 and 306, thus electrically shorting pad 304 to pad 306.

Figure 6A:
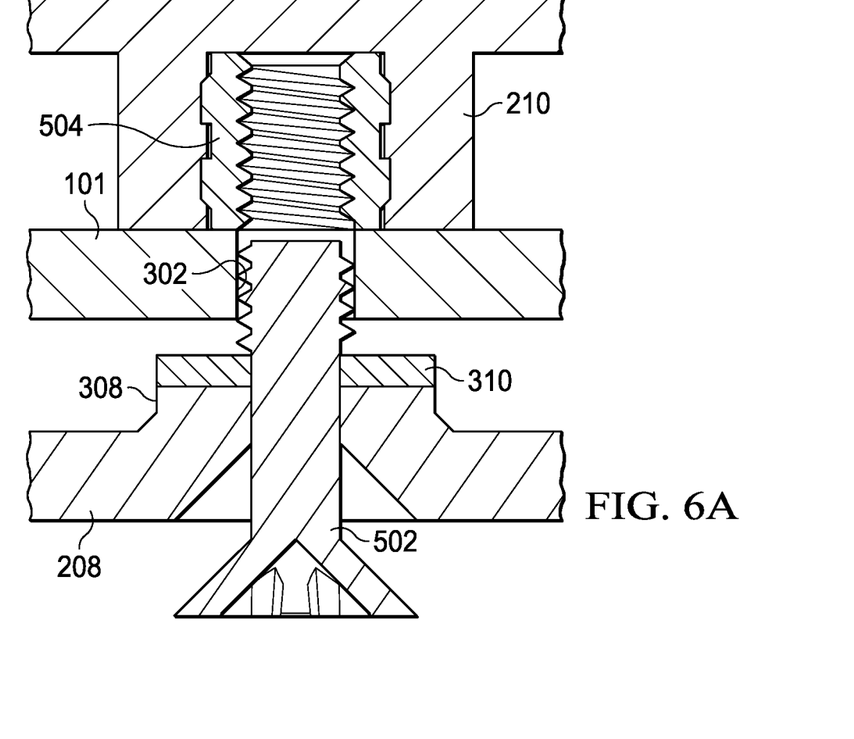
FIGS. 6A and 6B illustrate a side cross-sectional view of selected features for another example approach of engaging a base of a keyboard assembly to a cover of a keyboard assembly, in accordance with embodiments of the present disclosure.
Figure 6B:
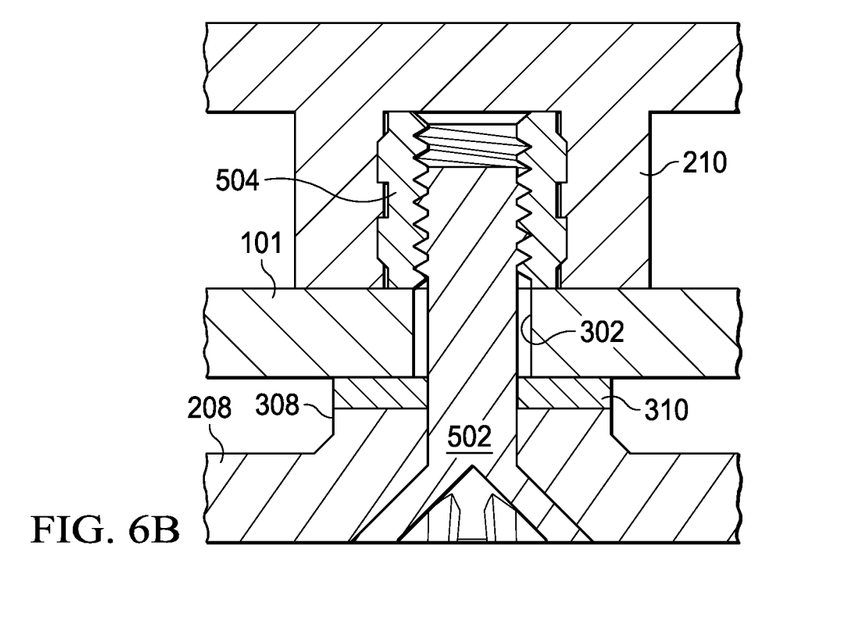

FIGS. 6A and 6B illustrate a side cross-sectional view of selected features for another example approach of engaging base 208 to cover 210, in accordance with embodiments of the present disclosure. As shown in FIGS. 6A and 6B, electrically-conductive material 310 may be formed on a guide feature 308 of base 208 or otherwise formed on the interior of base 208. In FIG. 6A, screw 502 is shown as mechanically disengaged from threaded insert 504 and electrically-conductive material 310 is not in physical contact with pads 304 and 306, and thus, pad 304 may be electrically isolated from pad 306. In FIG. 6B, screw 502 is shown as mechanically engaged with threaded insert 504, applying a mechanical force upon base 208 to cause physical contact of electrically-conductive material 310 to both of pads 304 and 306, thus electrically shorting pad 304 to pad 306.

Figure 7A:
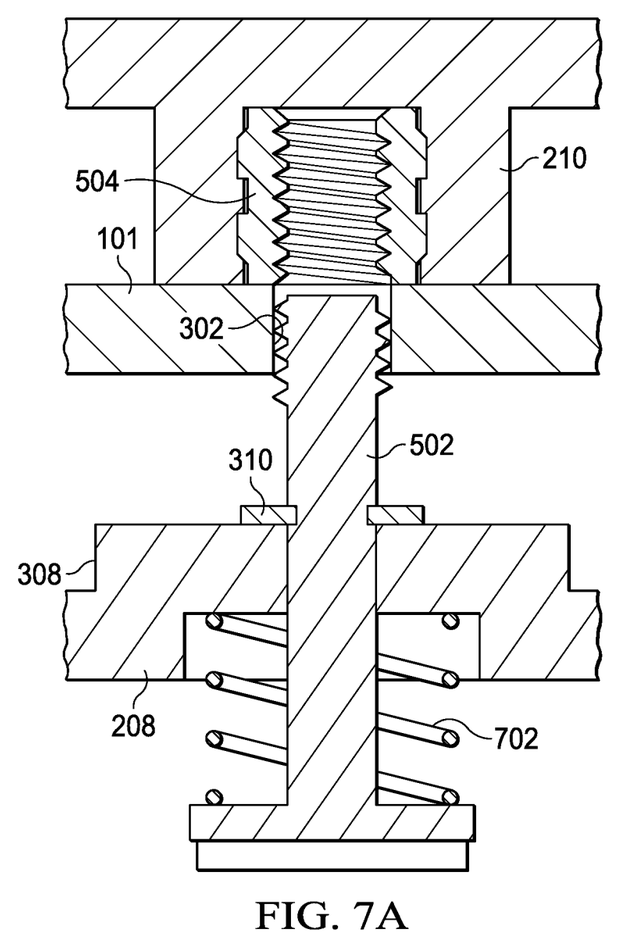
FIGS. 7A and 7B illustrate a side cross-sectional view of selected features for yet another example approach of engaging a base of a keyboard assembly to a cover of a keyboard assembly, in accordance with embodiments of the present disclosure.
Figure 7B:
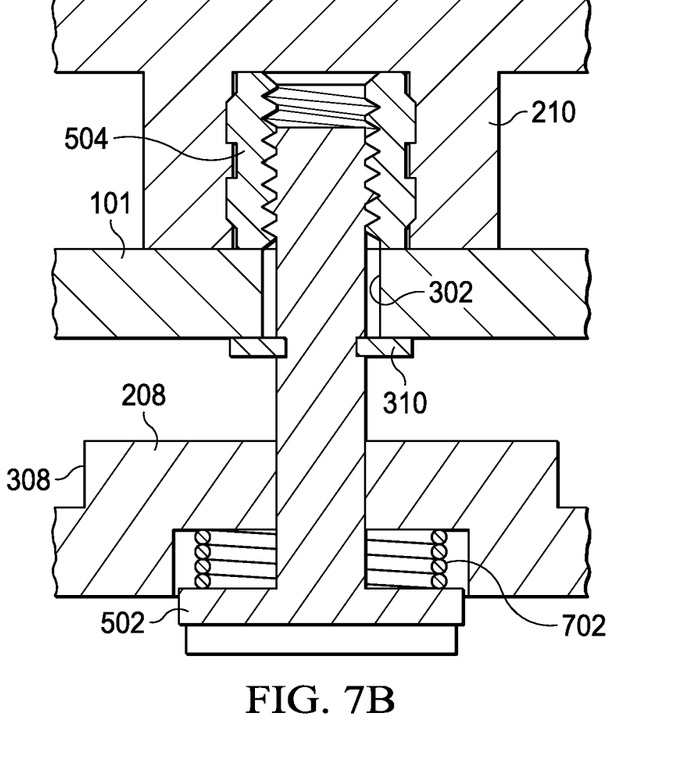

FIGS. 7A and 7B illustrate a side cross-sectional view of selected features for another example approach of engaging base 208 to cover 210, in accordance with embodiments of the present disclosure. As shown in FIGS. 7A and 7B, electrically-conductive material 310 may be an E-clip attached to captive screw 502 on the interior of base 208. Screw 502 may be mechanically coupled to cover 210 via a spring 702 and may be held captive to cover 210 by the E-clip used to form conductive material 310. In FIG. 7A, screw 502 is shown as mechanically disengaged from threaded insert 504 and electrically-conductive material 310 is not in physical contact with pads 304 and 306, and thus, pad 304 may be electrically isolated from pad 306. In FIG. 7A, the spring force of spring 702 may ensure that electrically-conductive material 310 is fully disengaged from pads 304 and 306. In FIG. 7B, screw 502 is shown as mechanically engaged with threaded insert 504, applying a mechanical force upon electrically-conductive material 310 to cause physical contact of electrically-conductive material 310 to both of pads 304 and 306, thus electrically shorting pad 304 to pad 306.

Figure 8:
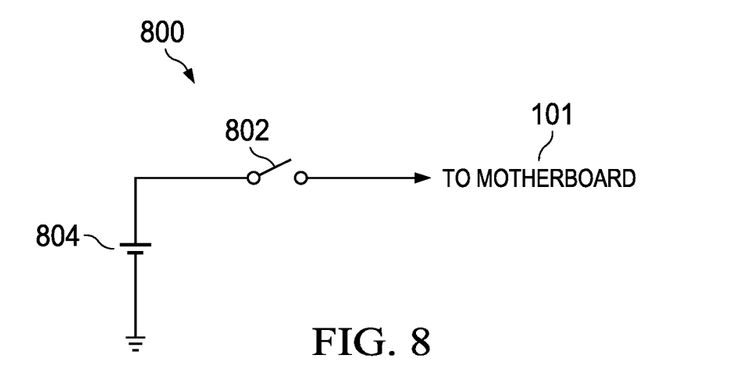
FIG. 8 illustrates an example circuit diagram demonstrating the electrical coupling and decoupling of a battery from components of an information handling system in response to the attachment of a base of a keyboard assembly to a cover of the keyboard assembly and removal of the base from the cover, in accordance with embodiments of the present disclosure.

FIG. 8 illustrates a circuit diagram of an example circuit 800 demonstrating the electrical coupling and decoupling of a battery 804 from electrical components of information handling system 102 in response to the attachment of base 208 to cover 210 and removal of base 208 from cover 210, in accordance with embodiments of the present disclosure.

Taken together, pad 304, pad 306, and electrically-conductive material 310 may be logically equivalent to a switch, wherein such switch is deactivated (e.g., off, open, or disabled) when electrically-conductive material 310 is physically disengaged from pad 304 and pad 306 and wherein such switch is activated (e.g., on, closed, or enabled) when electrically-conductive material 310 is physically engaged with pad 304 and pad 306. Such a switch is modeled as switch 802 in FIG. 8.

Accordingly, in circuit 800, when electrically-conductive material 310 is physically disengaged from pad 304 and pad 306, switch 802 may be deactivated and battery 804 may be electrically decoupled from motherboard 101 and/or other electronic components of information handling system 102. On the other hand, when electrically-conductive material 310 is physically engaged with pad 304 and pad 306, switch 802 may be activated and battery 804 may be electrically coupled to motherboard 101 and/or other electronic components of information handling system 102.

Figure 9:
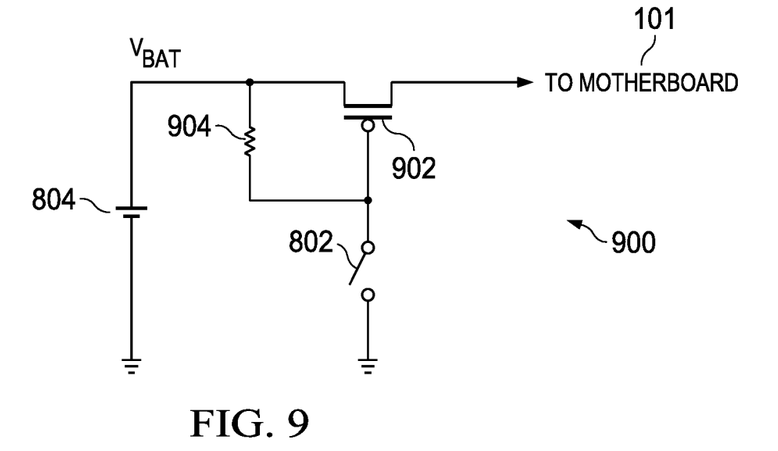
FIG. 9 illustrates another example circuit diagram demonstrating the electrical coupling and decoupling of a battery from components of an information handling system in response to the attachment of a base of a keyboard assembly to a cover of the keyboard assembly and removal of the base from the cover, in accordance with embodiments of the present disclosure.

FIG. 9 illustrates a circuit diagram of an example circuit 900 demonstrating the electrical coupling and decoupling of battery 804 from electrical components of information handling system 102 in response to the attachment of base 208 to cover 210 and removal of base 208 from cover 210, in accordance with embodiments of the present disclosure.

In circuit 900, when electrically-conductive material 310 is physically disengaged from pad 304 and pad 306, switch 802 may be deactivated, causing the gate terminal of p-type field effect transistor (PFET) 902 to have battery voltage $V_{BAT}$, thus deactivating PFET 902, and electrically decoupling battery 804 from motherboard 101 and/or other electronic components of information handling system 102. On the other hand, when electrically-conductive material 310 is physically engaged with pad 304 and pad 306, switch 802 may be activated, and a voltage drop across resistor 904 may cause activation of PFET 902, thus electrically coupling battery 804 to motherboard 101 and/or other electronic components of information handling system 102.

One advantage of circuit 900 as compared to circuit 800 is that it may allow pad 304 and pad 306 to be located remotely from battery 804. Another advantage of circuit 900 is that screw 502 or another fastener may be grounded when engaged with cover 210, consistent with other screws or fasteners that may be used to affix base 208 to cover 210.

Figure 10:
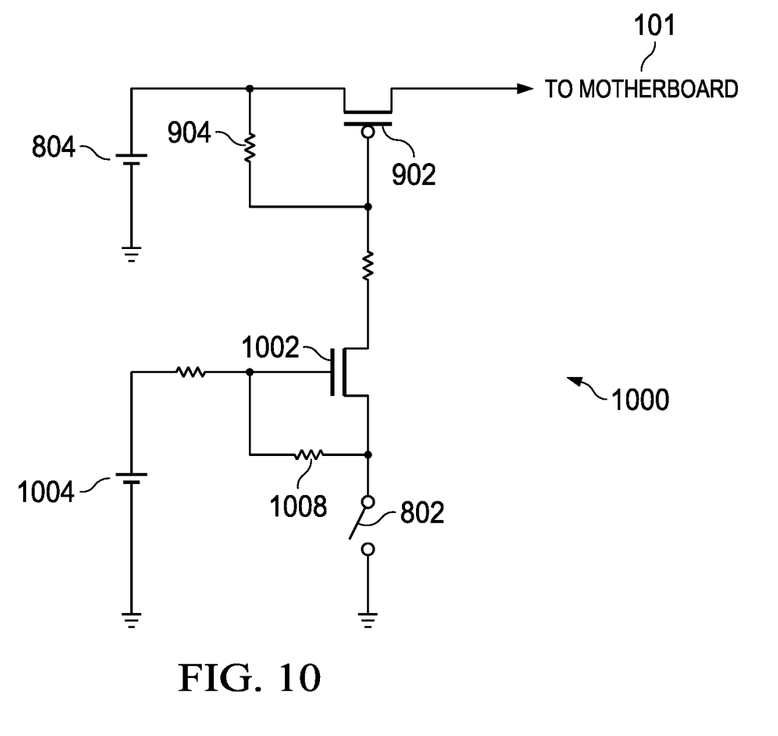
FIG. 10 illustrates another example circuit diagram demonstrating the electrical coupling and decoupling of a battery from components of an information handling system in response to the attachment of a base of a keyboard assembly to a cover of the keyboard assembly and removal of the base from the cover, in accordance with embodiments of the present disclosure.

FIG. 10 illustrates a circuit diagram of an example circuit 1000 demonstrating the electrical coupling and decoupling of battery 804 from electrical components of information handling system 102 in response to the attachment of base 208 to cover 210 and removal of base 208 from cover 210, in accordance with embodiments of the present disclosure.

In circuit 1000, a secondary battery 1004 may be present that is used solely by circuit 1000 in coupling battery 804 to and decoupling battery 804 from motherboard 101 and/or electrical components of information handling system 102. When electrically-conductive material 310 is physically disengaged from pad 304 and pad 306, switch 802 may be deactivated, causing the voltages at the source terminal and gate terminal of n-type field effect transistor (NFET) 1002 to be the same, thus deactivating NFET 1002. With NFET 1002 deactivated, the gate terminal of p-type field effect transistor (PFET) 902 may have battery voltage $V_{BAT}$, thus deactivating PFET 902, and electrically decoupling battery 804 from motherboard 101 and/or other electronic components of information handling system 102. On the other hand, when electrically-conductive material 310 is physically engaged with pad 304 and pad 306, switch 802 may be activated, and a voltage drop across resistor 1008 may cause activation of NFET 1002, which in turn may cause a voltage drop across resistor 904 which causes activation of PFET 902, thus electrically coupling battery 804 to motherboard 101 and/or other electronic components of information handling system 102.

One advantage of circuit 1000 as compared to circuit 800 is that it may allow pad 304 and pad 306 to be located remotely from battery 804.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described above, the principles of the present disclosure may be implemented using any number of techniques, whether currently known or not. The present disclosure should in no way be limited to the exemplary implementations and techniques illustrated in the figures and described above.

Unless otherwise specifically noted, articles depicted in the figures are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An information handling system comprising:
    a battery;
    a circuit board comprising:
      at least one electric component;
      a first electrically conductive pad; and
      a second electrically conductive pad in proximity to the first electrically conductive pad;
    an enclosure configured to house components of the information handling system including the battery and the circuit board, the enclosure comprising:
      a first member;
      a second member configured to be mechanically coupled to the first member; and
      a mechanical component comprising conductive material and configured to:
        electrically short the first electrically conductive pad to the second electrically conductive pad when the first member is mechanically coupled to the second member; and
        cause electrical isolation of the first electrically conductive pad from the second electrically conductive pad when the first member is mechanically decoupled from the second member; and
    a control circuit configured to:
      when the first electrically conductive pad is shorted to the second electrically conductive pad, cause the at least one electrical component to be electrically coupled to the battery; and
      when the first electrically conductive pad is electrically isolated from the second electrically conductive pad, cause the at least one electrical component to be electrically decoupled from the battery.

2. The information handling system of claim 1, wherein:
    the first member comprises a base of a keyboard assembly of the information handling system; and
    the second member comprises a cover of a keyboard assembly of the information handling system.

3. The information handling system of claim 1, wherein the mechanical component comprises a fastener for mechanically securing the first member to the second member, and the conductive material is formed on the fastener.

4. The information handling system of claim 1, wherein the mechanical component is integral to the first member, and the conductive material is formed on an interior surface of the first member.

5. The information handling system of claim 1, wherein the mechanical component comprises a fastener for mechanically securing the first member to the second member, and the conductive material comprises a retention feature for maintaining the fastener captive to the first member.

6. The information handling system of claim 1, wherein the control circuit comprises a switch separate from the first electrically conductive pad and the second electrically conductive pad, wherein the switch is electrically coupled between the battery and the at least one electric component and configured to:
    activate when the first electrically conductive pad is shorted to the second electrically conductive pad; and
    deactivate when the first electrically conductive pad is electrically isolated from the second electrically conductive pad.

7. The information handling system of claim 1, wherein the control circuit comprises:
    a first switch separate from the first electrically conductive pad and the second electrically conductive pad, wherein the first switch is electrically coupled between the battery and the at least one electric component; and
    a second switch separate from the first electrically conductive pad and the second electrically conductive pad, wherein the second switch is electrically coupled between one of the first electrically conductive pad and the second electrically conductive pad and a control terminal of the first switch and configured to:
      activate when the first electrically conductive pad is shorted to the second electrically conductive pad in order to cause the first switch to activate; and
      deactivate when the first electrically conductive pad is electrically isolated from the second electrically conductive pad in order to cause the first switch to deactivate.

8. A control circuit for use in an information handling system comprising:
    a battery;
    a circuit board comprising:
      at least one electric component;
      a first electrically conductive pad; and a second electrically conductive pad in proximity to the first electrically conductive pad; and an enclosure configured to house components of the information handling system including the battery and the circuit board, the enclosure comprising:

a first member;

a second member configured to be mechanically coupled to the first member; and a mechanical component comprising conductive material and configured to:

electrically short the first electrically conductive pad to the second electrically conductive pad when the first member is mechanically coupled to the second member; and cause electrical isolation of the first electrically conductive pad from the second electrically conductive pad when the first member is mechanically decoupled from the second member; and wherein the control circuit is configured to:

when the first electrically conductive pad is shorted to the second electrically conductive pad, cause the at least one electrical component to be electrically coupled to the battery; and when the first electrically conductive pad is electrically isolated from the second electrically conductive pad, cause the at least one electrical component to be electrically decoupled from the battery.

9. The control circuit of claim 8, wherein:

the first member comprises a base of a keyboard assembly of the information handling system; and the second member comprises a cover of a keyboard assembly of the information handling system.

10. The control circuit of claim 8, wherein the mechanical component comprises a fastener for mechanically securing the first member to the second member, and the conductive material is formed on the fastener.

11. The control circuit of claim 8, wherein the mechanical component is integral to the first member, and the conductive material is formed on an interior surface of the first member.

12. The control circuit of claim 8, wherein the mechanical component comprises a fastener for mechanically securing the first member to the second member, and the conductive material comprises a retention feature for maintaining the fastener captive to the first member.

13. The control circuit of claim 8, wherein the control circuit comprises a switch separate from the first electrically conductive pad and the second electrically conductive pad, wherein the switch is electrically coupled between the battery and the at least one electric component and configured to:

activate when the first electrically conductive pad is shorted to the second electrically conductive pad; and deactivate when the first electrically conductive pad is electrically isolated from the second electrically conductive pad.

14. The control circuit of claim 8, wherein the control circuit comprises:

a first switch separate from the first electrically conductive pad and the second electrically conductive pad, wherein the first switch is electrically coupled between the battery and the at least one electric component; and a second switch separate from the first electrically conductive pad and the second electrically conductive pad, wherein the second switch is electrically coupled between one of the first electrically conductive pad and the second electrically conductive pad and a control terminal of the first switch and configured to:

activate when the first electrically conductive pad is shorted to the second electrically conductive pad in order to cause the first switch to activate; and deactivate when the first electrically conductive pad is electrically isolated from the second electrically conductive pad in order to cause the first switch to deactivate.

15. A method for use in an information handling system comprising: a battery; a circuit board comprising: at least one electric component; a first electrically conductive pad; and a second electrically conductive pad in proximity to the first electrically conductive pad; and an enclosure configured to house components of the information handling system including the battery and the circuit board, the enclosure comprising: a first member; a second member configured to be mechanically coupled to the first member; and a mechanical component comprising conductive material and configured to: electrically short the first electrically conductive pad to the second electrically conductive pad when the first member is mechanically coupled to the second member; and cause electrical isolation of the first electrically conductive pad from the second electrically conductive pad when the first member is mechanically decoupled from the second member; and wherein the method comprises: when the first electrically conductive pad is shorted to the second electrically conductive pad, causing, by a control circuit, the at least one electrical component to be electrically coupled to the battery; and when the first electrically conductive pad is electrically isolated from the second electrically conductive pad, causing, by the control circuit, the at least one electrical component to be electrically decoupled from the battery.

16. The method of claim 15, wherein:

the first member comprises a base of a keyboard assembly of the information handling system; and the second member comprises a cover of a keyboard assembly of the information handling system.

17. The method of claim 15, wherein the mechanical component comprises a fastener for mechanically securing the first member to the second member, and the conductive material is formed on the fastener.

18. The method of claim 15, wherein the mechanical component is integral to the first member, and the conductive material is formed on an interior surface of the first member.

19. The method of claim 15, wherein the mechanical component comprises a fastener for mechanically securing the first member to the second member, and the conductive material comprises a retention feature for maintaining the fastener captive to the first member.

20. The method of claim 15, further comprising controlling a switch separate from the first electrically conductive pad and the second electrically conductive pad, wherein the switch is electrically coupled between the battery and the at least one electric component and controlling the switch comprises:

activating the switch when the first electrically conductive pad is shorted to the second electrically conductive pad; and deactivating the switch when the first electrically conductive pad is electrically isolated from the second electrically conductive pad.

21. The method of claim 15, further comprising:

controlling a first switch separate from the first electrically conductive pad and the second electrically conductive pad, wherein the first switch is electrically coupled between the battery and the at least one electric component; and controlling a second switch separate from the first electrically conductive pad and the second electrically conductive pad, wherein the second switch is electrically coupled between one of the first electrically conductive pad and the second electrically conductive pad and a control terminal of the first switch, wherein controlling the second switch comprises:

activating when the first electrically conductive pad is shorted to the second electrically conductive pad in order to cause the first switch to activate; and deactivating when the first electrically conductive pad is electrically isolated from the second electrically conductive pad in order to cause the first switch to deactivate.

* * * * *